(12) United States Patent
Chok

(10) Patent No.: US 6,339,027 B1
(45) Date of Patent: Jan. 15, 2002

(54) PROCESS FOR BORDERLESS STOP IN TIN VIA FORMATION

(75) Inventor: Kho Liep Chok, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/443,446

(22) Filed: Nov. 22, 1999

(51) Int. Cl.$^7$ ...................... H01L 21/302; H01L 21/311
(52) U.S. Cl. .................. 438/692; 438/700; 438/703
(58) Field of Search ................ 438/692, 703, 438/700

(56) References Cited

U.S. PATENT DOCUMENTS

| | | | | |
|---|---|---|---|---|
| 5,485,035 A | * | 1/1996 | Lin et al. ............... | 257/637 |
| 5,494,854 A | * | 2/1996 | Jain ........................ | 438/692 |
| 5,545,581 A | * | 8/1996 | Armacost et al. ...... | 438/631 |
| 5,757,077 A | * | 5/1998 | Chung et al. ........... | 257/736 |
| 5,840,624 A | | 11/1998 | Jang et al. .............. | 438/624 |
| 5,891,799 A | | 4/1999 | Tsui ........................ | 438/624 |
| 5,904,569 A | | 5/1999 | Kitch ...................... | 438/692 |
| 5,920,792 A | | 7/1999 | Lin .......................... | 438/633 |

FOREIGN PATENT DOCUMENTS

EP 0564136 A1 * 10/1993 ........... H01L/21/90

* cited by examiner

Primary Examiner—Benjamin L. Utech
Assistant Examiner—Lynette T. Umez-Eronini
(74) Attorney, Agent, or Firm—George O. Saile; Rosemary L. S. Pike; Stephen G. Stanton

(57) ABSTRACT

A method of forming via plugs in a semiconductor device, comprising the following steps. A semiconductor structure having an upper first oxide layer and at least two metal lines formed on the upper oxide layer are provided. The metal lines are spaced apart a predetermined distance and each having a lower barrier layer, a middle layer, and an upper etch stop layer. A second oxide layer is deposited over the first oxide layer and the pair of metal lines. An etch barrier layer is formed over the second oxide layer. The structure is planarized to form openings in the etch barrier layer over the metal lines. A third oxide layer is deposited and patterned over the planarized structure to form via openings through the etch barrier layer openings to the upper etch stop layers on the metal lines. Metal via plugs are formed in the via openings.

30 Claims, 3 Drawing Sheets

PROCESS FOR BORDERLESS STOP IN TIN VIA FORMATION

FIELD OF THE INVENTION

The present invention relates generally to forming via plugs in semiconductor devices, and more specifically to forming via plugs to borderless structure semiconductor devices.

BACKGROUND OF THE INVENTION

As the design rule for semiconductor devices constantly decreases, borderless structures, such as contacts, have been begun to be used to permit the further microminiaturization. However, the use of borderless structures requires a level and degree of accuracy in fabricating these devices that is not met to achieve acceptable yields. Misaligned via openings can create metal via plugs formed in contact with sidewalls of metal lines that degrade the electromigration of the metal via plugs.

U.S. Pat. No. 5,920,792 to Lin describes an etch stop over an HDP-CVD oxide layer. A first HDP-CVD oxide layer is formed over a metal wiring structure having a gap. A second HDP-CVD oxide layer is formed over the first HDP-CVD oxide layer. The second HDP-CVD oxide layer having lower etching/depositing component ratio, and thus a higher CMP removal rate, than the first HDP-CVD oxide layer. A thin CMP passive layer may be deposited over the second HDP-CVD oxide layer. The thin CMP passive layer having the same etching/depositing component ratio as the second HDP-CVD oxide layer. The structure is chemical-mechanically polished (CMP) wherein: the thin CMP passive layer minimizes dishing in the recessed areas and is removed; the second HDP-CVD oxide layer is polished and removed by CMP until the first HDP-CVD oxide stop layer is reached resulting in an essentially planar surface.

U.S. Pat. 5,904,569 to Kitch describes a process of forming self-aligned vias in multi-metal integrated circuits using self-aligned metal pillars to connect metal layers separated by a dielectric. The metal pillars comprise a first aluminum (Al) layer, a middle titanium nitride (TiN) layer that acts as an etch stop layer, and an upper Al layer.

U.S. Pat. No. 5,891,799 to Tsui describes a method for making stacked and borderless via structures on multilevel metal interconnections for integrated circuits.

U.S. Pat. No. 5,840,624 to Jang et al. describes a method for forming a borderless contact or via hole in which a thin silicon nitride layer is used as an etch stop to prevent attack of an underlying interlevel dielectric (ILD) layer during the opening of the borderless contact or via hole in an overlying ILD layer.

SUMMARY OF THE INVENTION

Accordingly, it is an object of the present invention to provide a method of forming self-aligned via plugs to borderless structures in semiconductor structures.

Another object of the present invention is to provide a method of forming self-aligned via plugs to borderless structures in semiconductor structures using etch stop layers over the borderless structures.

A further object of the present invention is to provide a method of forming self-aligned via plugs to borderless structures in semiconductor structures without the need to mask and etch the SiN etch stop layer.

Yet another object of the present invention is to provide a method of forming self-aligned via plugs to borderless structures in semiconductor structures using a self-aligned SiN etch barrier that prevents inter-metal shorts otherwise due to via over-etch.

Other objects will appear hereinafter.

It has now been discovered that the above and other objects of the present invention may be accomplished in the following manner. Specifically, a semiconductor structure having an upper first oxide layer and at least two metal lines formed on the upper oxide layer are provided. The metal lines are spaced apart a predetermined distance and each having a lower barrier layer, a middle layer, and an upper etch stop layer. A second oxide layer is deposited over the first oxide layer and the pair of metal lines. An etch barrier layer is formed over the second oxide layer. The structure is planarized to form openings in the etch barrier layer over the metal lines. A third oxide layer is deposited and patterned over the planarized structure to form via openings through the etch barrier layer openings to the upper etch stop layers on the metal lines. Metal via plugs are formed in the via openings.

BRIEF DESCRIPTION OF THE DRAWINGS

The features and advantages of the method of forming an liquid crystal display lower substrate according to the present invention will be more clearly understood from the following description taken in conjunction with the accompanying drawing in which like reference numerals designate similar or corresponding elements, regions and in which.

DETAILED DESCRIPTION OF THE PREFERRED EMBODIMENT

Problem Solved by the Invention

Figure 1:
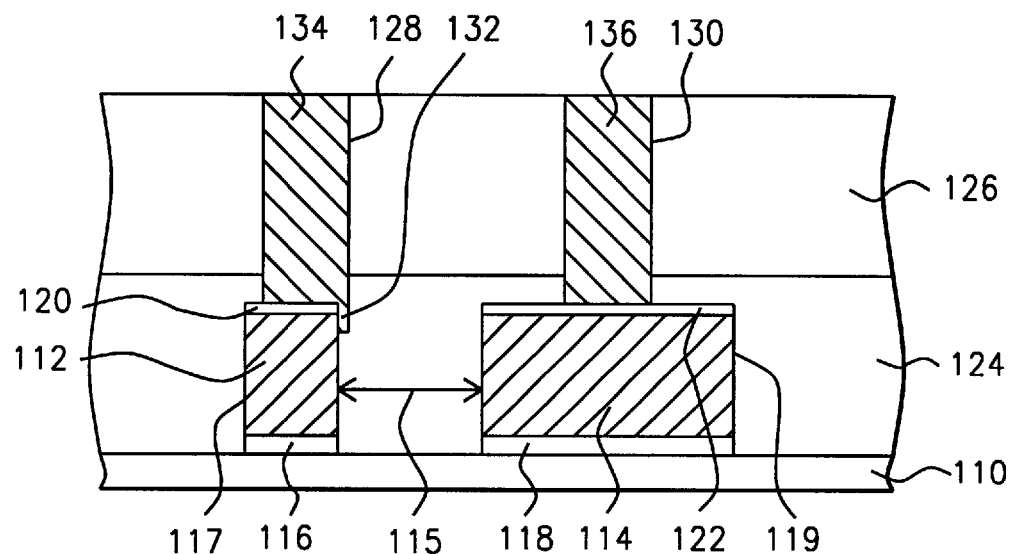
FIG. 1 illustrates in cross-sectional representation conventional via plugs formed to a pair of borderless metal wires known to the inventor.

FIG. 1 illustrates a conventional via plug structure to borderless metal wires known by the inventor (not to be considered as prior art and not the invention).

Semiconductor structure 110 includes an upper silicon oxide layer. Metal lines 112, 114 are formed over semiconductor structure 110 and include lower barrier layers 116, 118, middle layers 117, 119, and upper TiN layers 120, 122, respectively. Metal lines 112, 114 are spaced apart distance 115 greater than or equal to 0.23 µm.

Metal line middle layers 117, 119 may be comprised of AlCu or AlSiCu. Lower barrier layers 116, 118 may be comprised of Ti, TiN, or Ti/TiN. Upper TiN or Ti/TiN layers 120, 122 function as etch stop layers.

A second oxide layer 124 is deposited and planarized over semiconductor structure 110 and metal lines 112, 114.

A third oxide layer, or intermetal dielectric layer (IMD), 126 is deposited, planarized, and patterned over second oxide layer 124 to form via openings 128, 130. A not uncommon problem is that etching of second oxide layer 124 to form via openings 128, 130 may etch through upper TiN layers 120, 122 and gouge into middle layers 117, 119 of metal lines 112, 114, respectively (not shown) which degrades the electromigration (EM) of metal via plugs 134, 136. This may be caused because variations in the thickness of IMD layer 126 can introduce over-etching during the etching of via openings 128, 130. To reduce variations in via Rc (stopping TiN anti-reflective coating (ARC) 120, 122 will result in a higher Rc, more over-etch is introduced to ensure consistency. If oxide is left over the TiN, the via Rc increases. Even a thick TiN layer can increase Via Rc. If an overetch is used to remove all the oxide, the etch goes through the TiN and causes electromigration.

Further, as shown in FIG. 1, another problem occurs when, for example, via opening 128 is misaligned and second oxide layer 124 is partially etched exposing part of sidewall 132 of middle layer 117 of metal line 112. When metal via plugs 134, 136 are formed within via openings 128, 130, respectively, metal via plug 134 contacts sidewall 132 of middle layer 117 of metal line 112 which also degrades the EM of metal via plugs 134.

Preferred Embodiment of the Invention

The inventor has discovered a process of forming via plugs in semiconductor devices that (1) prevents misaligned via openings from exposing a portion of the sidewalls of the underlying metal lines so that when metal via plugs are formed within the via openings a portion of the metal via plugs do not come into contact with the underlying metal line thus preventing degradation of the EM of the metal via plugs; and (2) permits defining an SiN etch barrier without masking and etching of the SiN etch barrier which greatly simplifies the process.

Figure 2:
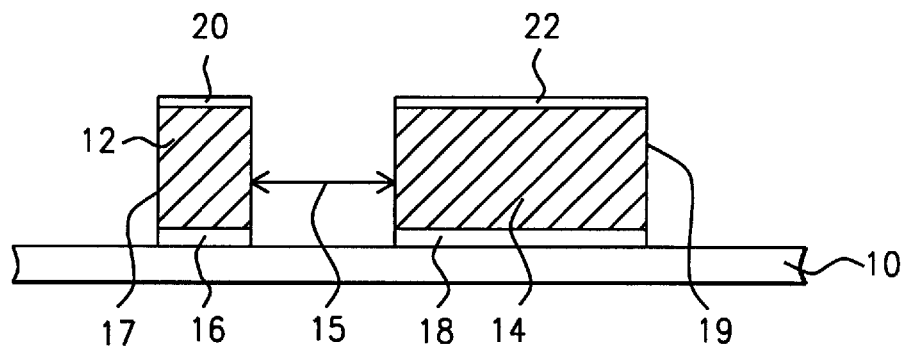
FIGS. 2 through 7 schematically illustrate in cross-sectional representation a preferred embodiment of the present invention.

Accordingly as shown in FIG. 2, starting semiconductor structure 10 includes an upper oxide layer and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. Unless otherwise specified, all structures, layers, etc. may be formed or accomplished by conventional methods known in the prior art.

One or more two metal lines 12, 14 are formed over semiconductor structure 10. If more than one line if formed, the lines are spaced apart a distance 15 greater than or equal to 0.23 $\mu$m, and more preferably about 0.3 $\mu$m at gap 13. The upper surface of the semiconductor structure can be a dielectric layer (e.g., interlevel dielectric (ILD) or inter metal dielectric (IMD) layer) composed of an oxide, such as a doped oxide or oxynitride. Metal lines 12, 14 include lower barrier layers 16, 18, middle layers 17, 19, and upper etch stop layers 20, 22, respectively.

It is obvious to one skilled in the art that even though metal line 12 is shown in FIG. 2 as having a width less than that of metal line 14, the widths could be reversed, or both metal lines 12, 14 may have the same width—either equal to the width of metal line 12 or metal line 14.

Middle layers 17, 19 are from about 4500 to 5500 Å thick, and more preferably about 5000 Å thick, and may be comprised of AlSiCu and are more preferably comprised of AlCu.

Lower barrier layers 16, 18 are from about 180 to 440 Å thick and more preferably from about 200 to 400 Å thick, and may be comprised of Ti or TiN, and more preferably Ti/TiN. Barrier layers 16, 18 serve to prevent diffusion of middle layers 17, 19 into the upper oxide layer of semiconductor structure 10.

Upper etch stop layers 20, 22 are anti-reflective coatings from about 280 to 370 Å thick, and more preferably from about 300 to 350 Å thick, and may be comprised of Ti, Ti/TiN and more preferably a TiN anti-reflective coating.

Figure 3:
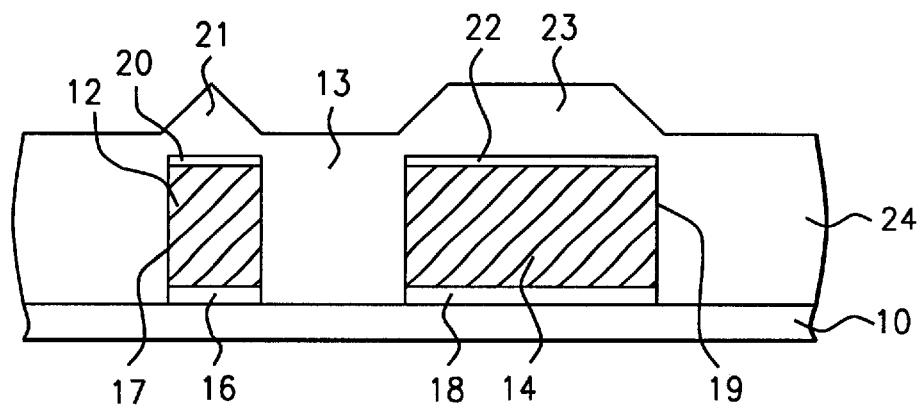

As shown in FIG. 3, one key step of the present invention is that oxide layer 24 is deposited by a non-conformal, high density plasma (HPD) process to a depth just sufficient to fill gap 13 between metal lines 12, 14 and may be up to a depth of about 6000 Å.

It is critical that an HPD process be used to form the layer 24. HPD processes include processing with low energy ions with a density equal to or greater than 1E12 cm$^{-2}$. HPD process that can be used to form layer 24 include ICP, DPS, electron cyclotron resonance (ECR), SiH$_4$/O$_2$/Ar, or SiH$_4$/O$_2$/Ar/SiFe processes. Since the HDP process is non-conformal, the width of peak portions 21, 23 of HDP-oxide layer 24 over metal lines 12, 14, respectively, mirror the width of metal lines 12, 14, and are self-aligned over metal lines 12,14, respectively. The importance of which will become evident hereafter.

The HDP process may be conducted from about 320 to 370° C., and more preferably about 350° C., using silane and O$_2$/Ar.

The HPD process is preferably preformed with a deposition to sputter ratio between about 2.0 and 3.0.

HDP-oxide layer 24 may comprise HDP-silicon oxide or doped versions thereof such as HDP-PSG or HDP-FSG.

Figure 4:
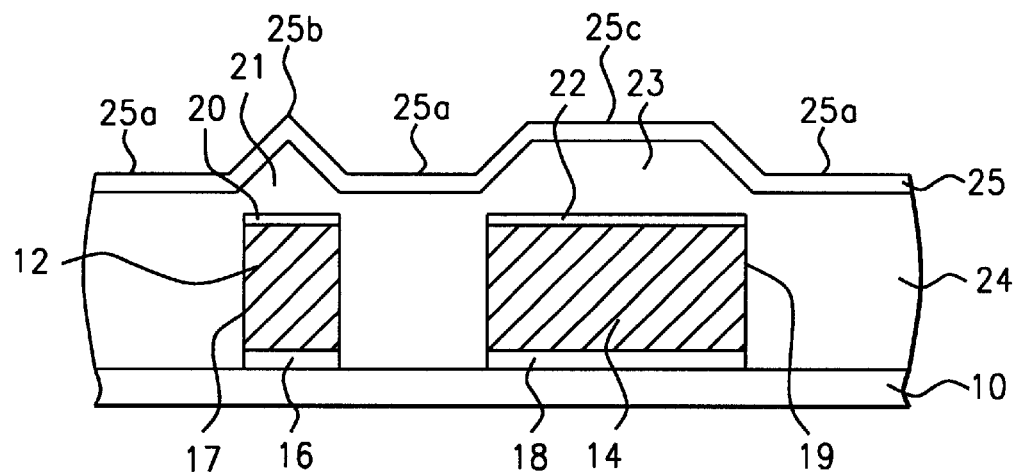

As shown in FIG. 4, etch barrier layer 25 is deposited over HDP-oxide layer 24 to a thickness of from about 950 to 1050 Å, and more preferably 1000 Å. Etch barrier layer 25 may be comprised of H-rich silicon nitride or Si-rich silicon nitride and more preferably SiN.

SiN etch barrier layer includes lower, flat portions 25a, and raised peak portion 25b over HDP-oxide peak 21 over metal line 12, and raised peak portion 25c over HDP-oxide peak 23 over metal line 14.

Figure 5:
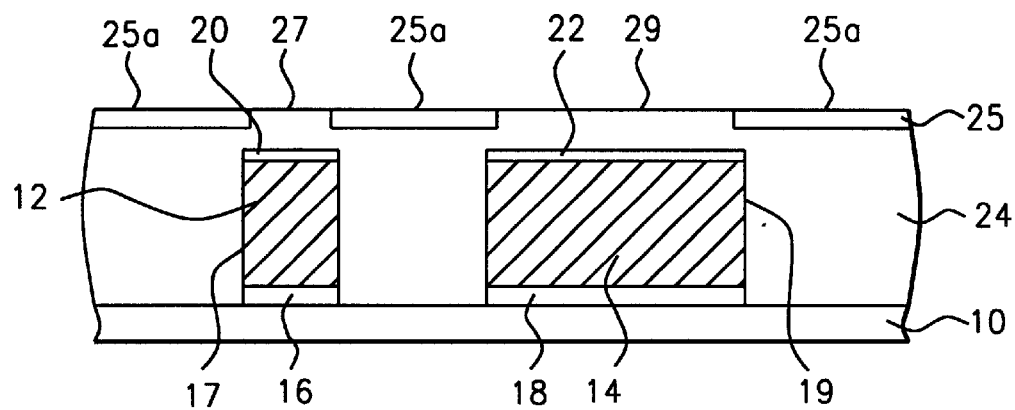

As shown in FIG. 5, an oxide chemical-mechanical polishing (CMP) is then conducted to polish and remove SiN etch barrier layer peak portions 25b, 25c and HDP-oxide peak portions 21, 23, each over metal lines 12, 14, respectively.

It is noted that since HDP-oxide peak portions 21, 23 are the same width as, and self-aligned over, the underlying metal lines 12, 14 openings 27, 29 formed by the oxide CMP in SiN etch barrier layer between flat portions 25a are also self-aligned over metal lines 12, 14, respectively. The width of SiN etch barrier layer openings 27, 29 are slightly less than the width of metal lines 12, 14, respectively, by more than about 5%, and more preferably from about 5 to 10%.

Figure 6:
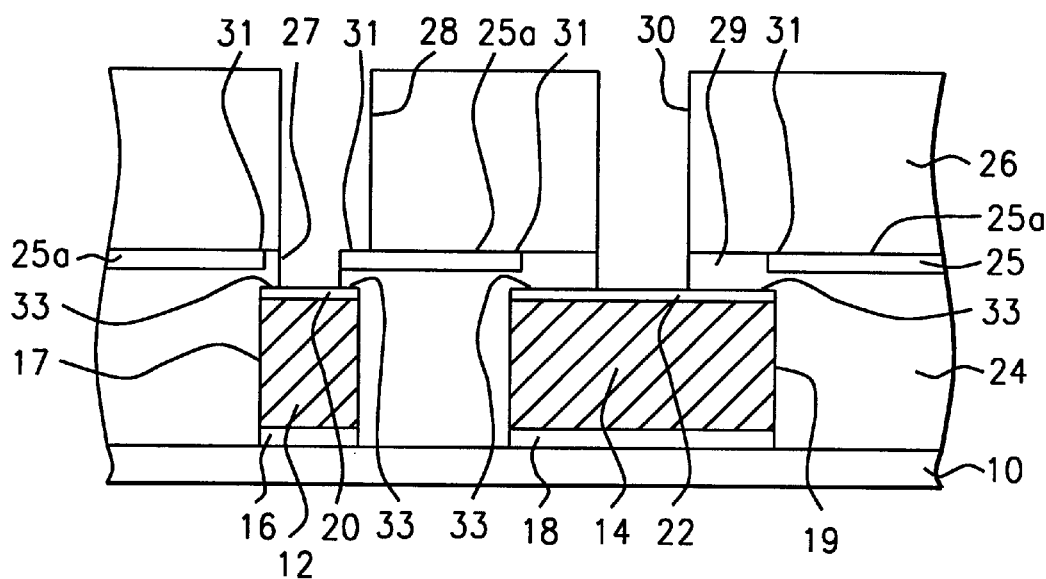

As shown in FIG. 6, cap oxide layer 26 is deposited and patterned over oxide layer 24 and SiN etch barrier layer flat portions 25a to form via openings 28, 30. Via openings 28, 30 are designed to pass through SiN etch barrier layer openings 27, 29 and oxide layer 24 to expose TiN layers 20, 22 with TiN layers 20, 22 acting as etch stop layers. Via openings 28, 30 are etched through the cap oxide layer 26 and preferably stop in the TiN layer 22. A photoresist layer (not shown) may be used to for the via openings. The SiN etch barrier layers 25a act as etch guides/stops. The etch preferably stops on the TiN layers 20 22 or within the TiN layers (removing some portion of the TiN layer, but not exposing the underlying metal layer.)

If a via opening is misaligned, such as, for example, via opening 28 as shown in FIG. 6, SiN etch barrier layer flat portion 25a at 31 is resistant to the via opening 28, 30 etch and is not etched. Since openings 27, 29 within SiN etch barrier layer are self-aligned over metal lines 12, 14 and have a width slightly less than the width of metal lines 12, 14 parts 31 of SiN etch barrier layer flat portions 25a shield the underlying edges 33 of metal lines 12, 14 and the portions of oxide layer 24 there between.

Thus the design and process of the present invention eliminates the possibility of a misaligned via opening 28, for example, from exposing a portion of a sidewall of middle AlCu layer 17 of metal line 12, for example.

Figure 7:
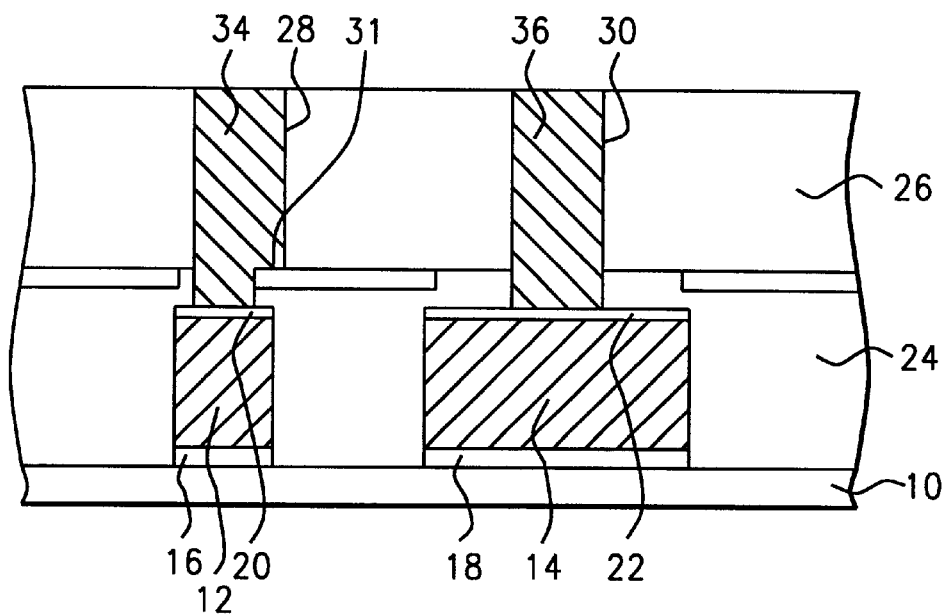

As shown in FIG. 7, a metal layer (not shown) is deposited over oxide layer 26, filling via openings 28, 30, and planarized to form metal via plugs 34, 36. Metal via plugs 34, 36 may be comprised of AlCu or Cu, and more preferably tungsten (W).

Since any misaligned via opening 28 for example as shown in FIGS. 6 and 7, is barred from penetrating parts 31 of SiN etch barrier layer flat portions 25a, metal via plug 34, for example as shown in FIG. 7, does not contact any sidewall portion of middle AlCu layer 17 of metal line 12. Thus the electromigration (EM) of W metal via plug 34 is not degraded.

In summary, the process of the present invention improves the electromigration of W metal via plugs 34, 36 by minimizing or eliminating direct contact between W metal via plugs 34, 36 and middle AlCu layer of metal lines 12, 14.

While particular embodiments of the present invention have been illustrated and described, it is not intended to limit the invention, except as defined by the following claims.

I claim:

1. A method of forming via plugs in a semiconductor device, comprising the steps of:

providing a semiconductor structure having an upper first oxide layer and at least two metal lines formed on said upper oxide layer; said metal lines being spaced apart a first distance and each having a lower barrier layer, a middle layer, and an upper etch stop layer;

depositing a second oxide layer over said first oxide layer and said pair of metal lines; said second oxide layer is non-conformal;

forming an etch barrier layer over said second oxide layer;

planarizing said structure to form openings in said etch barrier layer over said metal lines;

depositing and patterning a third oxide layer over said planarized structure to form via openings through said etch barrier layer openings to said upper etch stop layers on said metal lines; and forming metal via plugs in said via openings.

2. The method of claim 1, wherein said metal lines are borderless metal lines.

3. The method of claim 1, wherein said first distance between said metal lines is greater than about 0.23 μm.

4. The method of claim 1, wherein said etch barrier layer is comprised of a material selected from the group consisting of SiN, SiON, H-rich silicon nitride, and Si-rich silicon nitride.

5. The method of claim 1, wherein said lower barrier layer is comprised of a material selected from the group consisting of Ti, TiN, and Ti/TiN.

6. The method of claim 1, wherein said middle layer is comprised of a material selected from the group consisting of AlCu and AlSiCu.

7. The method of claim 1, wherein said upper etch stop layer is an anti-reflective coating comprised of a material selected from the group consisting of TiN and Ti/TiN.

8. The method of claim 1, wherein said second oxide layer is formed by a high-density plasma (HDP) process.

9. The method of claim 1, wherein said second oxide layer is comprised of a material selected from the group consisting of HDP-oxide, HDP-FSG and HDP-PSG.

10. The method of claim 1, wherein said metal lines comprise said lower barrier layer selected from the group consisting of Ti and TiN, said middle layer of AlCu, and said upper etch stop layer is a TiN ARC.

11. The method of claim 1, wherein said metal via plugs are comprised of a metal selected from the group consisting of tungsten, aluminum, Cu, and AlCu.

12. The method of claim 1, wherein said metal lines comprise said lower barrier layer selected from the group consisting of Ti, TiN and Ti/TIN, a middle layer comprised of a material selected from the group consisting of AlCu and AlSiCu, and said upper etch stop layer is an ARC selected from the group consisting of TiN and Ti/TiN; said second oxide layer is an HDP-oxide selected from the group consisting of HDP-FSG and HDP-PSG; said etch barrier layer comprises a material selected from the group consisting of SiN, (SiON), H-rich silicon nitride, and Si-rich silicon nitride; and said metal via plugs comprise a material selected from the group consisting of tungsten, aluminum, and AlCu.

13. A method of forming via plugs in a semiconductor device, comprising the steps of:

providing a semiconductor structure having an upper first oxide layer and at least two metal lines formed on said upper oxide layer; said metal lines being spaced apart greater that about 0.23 μm and each having a lower barrier layer and an upper etch stop layer;

depositing a second oxide layer over said first oxide layer and said pair of metal lines by a high-density plasma (HDP) process;

forming an etch barrier layer over said second oxide layer;

planarizing said structure using a chemical-mechanical polish process to form openings in said etch barrier layer over said metal lines;

depositing and patterning a third oxide layer over said planarized structure to form via openings through said etch barrier layer openings to said upper etch stop layers on said metal lines; and forming metal via plugs in said via openings.

14. The method of claim 13, wherein said metal lines are borderless metal lines.

15. The method of claim 13, wherein said etch barrier layer is comprised of a material selected from the group consisting of SiN, SiON, H-rich SiN and Si-rich SiN.

16. The method of claim 13, wherein said middle layer is comprised of a material selected from the group consisting of AlCu and AlSiCu.

17. The method of claim 13, wherein said lower barrier layer is comprised of a material selected from the group consisting of Ti, TiN, and Ti/TiN.

18. The method of claim 13, wherein said upper etch stop layer is an anti-reflective coating comprised of a material selected from the group consisting of TiN, Ti, and Ti/TiN.

19. The method of claim 13, wherein said second oxide layer is comprised of a material selected from the group consisting of HDP-oxide, HDP-FSG and HDP-PSG.

20. The method of claim 13, wherein said metal lines comprise said lower barrier layer selected from the group consisting of Ti, TiN and Ti/TIN, a middle layer comprised of a material selected form the group consisting of AlCu and AlSiCu, and said upper etch stop layer is an ARC selected from the group consisting of TiN and Ti/TiN.

21. The method of claim 13, wherein said metal via plugs are comprised of a metal selected from the group consisting of tungsten, aluminum, Cu, and AlCu.

22. The method of claim 13, wherein said metal lines comprise said lower barrier layer selected from the group consisting of Ti and TiN, a middle layer of AlCu, and said upper etch stop layer is a TiN ARC; said second oxide layer is HDP-oxide; said etch barrier layer is SiN; and said metal via plugs are tungsten.

23. A method of forming via plugs in a semiconductor device, comprising the steps of:

providing a semiconductor structure having an upper first oxide layer and at least two borderless metal lines formed on said upper oxide layer; said metal lines being spaced apart greater than about 0.23 μm and each having a lower barrier layer and an upper anti-reflective coating etch stop layer;

depositing a second oxide layer over said first oxide layer and said pair of metal lines by a high-density plasma (HDP) process;

forming an etch barrier layer over said second oxide layer; said etch barrier layer being comprised of a material selected from the group consisting of SiN, SiON, H-rich SiN, and Si-rich SiN;

planarizing said structure using a chemical-mechanical polish process to form self-aligned openings in said etch barrier layer over said metal lines;

depositing and patterning a third oxide layer over said planarized structure to form via openings through said etch barrier layer openings to said upper etch stop layers on said metal lines; and forming metal via plugs in said via openings.

24. The method of claim 23, wherein said lower barrier layer is comprised of a material selected from the group consisting of Ti, TiN and Ti/TiN.

25. The method of claim 23, wherein said middle layer is comprised of a material selected from the group consisting of AlCu and AlSiCu.

26. The method of claim 23, wherein said upper anti-reflective coating etch stop layer is comprised of a material selected from the group consisting of TiN, Ti, and Ti/TiN.

27. The method of claim 23, wherein said second oxide layer is comprised of a material selected from the group consisting of HDP-oxide, HDP-FSG and HDP-PSG.

28. The method of claim 23, wherein said metal lines comprise said lower barrier layer selected from the group consisting of Ti and TiN, a middle layer of AlCu, and said upper anti-reflective coating etch stop layer is a TiN ARC.

29. The method of claim 23, wherein said metal via plugs are comprised of a metal selected from the group consisting of tungsten, aluminum, Cu, and AlCu.

30. The method of claim 23, wherein said metal lines comprise said lower barrier layer selected from the group consisting of Ti and TiN, a middle layer of AlCu, and said upper anti-reflective coating etch stop layer is a TiN ARC; said second oxide layer is HDP-oxide; said etch barrier layer is SiN; and said metal via plugs are tungsten.

* * * * *